US010428427B2

(12) United States Patent
Hou et al.

(10) Patent No.: US 10,428,427 B2
(45) Date of Patent: Oct. 1, 2019

(54) FABRICATION METHOD FOR TWO-DIMENSIONAL MATERIALS

(71) Applicant: NATIONAL CHIAO TUNG UNIVERSITY, Hsinchu (TW)

(72) Inventors: Tuo-Hung Hou, Hsinchu (TW); Jyun-Hong Huang, Kaohsiung (TW)

(73) Assignee: NATIONAL CHIAO TUNG UNIVERSITY, Hsinchu (TW)

(*) Notice: Subject to any disclaimer, the term of this patent is extended or adjusted under 35 U.S.C. 154(b) by 0 days.

(21) Appl. No.: 15/699,622

(22) Filed: Sep. 8, 2017

(65) Prior Publication Data
US 2018/0291508 A1 Oct. 11, 2018

(30) Foreign Application Priority Data

Apr. 7, 2017 (TW) .............................. 106111790 A

(51) Int. Cl.
C23C 14/02 (2006.01)
C23C 16/50 (2006.01)
C23C 16/56 (2006.01)
C23C 16/52 (2006.01)
C23C 16/448 (2006.01)
C23C 14/58 (2006.01)
C23C 14/24 (2006.01)
C23C 14/06 (2006.01)
(Continued)

(52) U.S. Cl.
CPC .......... C23C 16/50 (2013.01); C23C 14/0623 (2013.01); C23C 14/0635 (2013.01); C23C 14/0641 (2013.01); C23C 14/24 (2013.01); C23C 14/34 (2013.01); C23C 14/5806 (2013.01); C23C 16/448 (2013.01); C23C 16/52 (2013.01); C23C 16/56 (2013.01); C23C 28/04 (2013.01)

(58) Field of Classification Search
CPC ..... C23C 14/0021; C23C 14/24; C23C 14/34; C23C 16/56
See application file for complete search history.

(56) References Cited

U.S. PATENT DOCUMENTS 4,684,542 A * 8/1987 Jasinski ............ H01L 21/28061
257/E21.2
5,108,843 A * 4/1992 Ohtaka ............... H01L 21/2022
428/446
5,958,358 A 9/1999 Tenne et al.
(Continued)

FOREIGN PATENT DOCUMENTS

WO WO 2014/064057 A2 5/2014

OTHER PUBLICATIONS

Naylor, Carl H., et al., "Large-area synthesis of high-quality monolayer 1T'-WTe2 flakes". 2D Materials 4 (2017) 021008, pp. 1-11.*
(Continued)

Primary Examiner — Bret P Chen
(74) Attorney, Agent, or Firm — Birch, Stewart, Kolasch & Birch, LLP

(57) ABSTRACT

A fabrication method for two-dimensional materials of the present invention includes the following steps: forming a thin film having at least one two-dimensional element on a substrate; forming at least one capping layer on the thin film; annealing the thin film to form a two-dimensional material film after the capping layer is formed.

16 Claims, 17 Drawing Sheets

(51) Int. Cl.
*C23C 14/34* (2006.01)
*C23C 28/04* (2006.01)

(56) References Cited

U.S. PATENT DOCUMENTS

| | | | |
|---|---|---|---|
| 6,380,558 B1* | 4/2002 | Yamazaki | H01L 27/12 257/57 |
| 9,406,872 B1* | 8/2016 | Annunziata | H01L 43/02 |
| 9,460,919 B1 | 10/2016 | Chueh et al. | |
| 9,527,062 B2 | 12/2016 | Iezzi et al. | |
| 2008/0101109 A1* | 5/2008 | Haring-Bolivar | H01L 27/2409 365/163 |
| 2010/0303722 A1* | 12/2010 | Jin | A61K 27/30 424/9.1 |
| 2011/0318249 A1* | 12/2011 | Nakayama | C01B 37/00 423/325 |
| 2014/0209911 A1* | 7/2014 | Kawashima | H01L 21/02422 257/66 |
| 2014/0251204 A1 | 9/2014 | Najmaei et al. | |
| 2015/0044391 A1 | 2/2015 | Yumoto et al. | |
| 2015/0060768 A1* | 3/2015 | Dodabalapur | H01L 21/02425 257/29 |
| 2015/0146341 A1* | 5/2015 | Fuchigami | H01G 4/10 361/301.4 |
| 2016/0233322 A1 | 8/2016 | Yeh et al. | |
| 2016/0340774 A1* | 11/2016 | Sarakinos | C23C 14/0688 |
| 2016/0372543 A1* | 12/2016 | Xie | H01L 29/517 |
| 2017/0073812 A1* | 3/2017 | Sundaram | C23C 16/56 |
| 2017/0117417 A1* | 4/2017 | Akinwande | H01L 29/66772 |

OTHER PUBLICATIONS

Gupta, Ankur, et al., "Recent development in 2D materials beyond graphene." Progress in Materials Science 73 (2015) 44-126.*

Bilgin, Ismail, et al., "Chemical Vapor Deposition Synthesized Atomically Thin Molybdenum Disulfide with Optoelectronic-Grade Crystalline Quality". ACS Nano (2015), pp. 1-27.*

Naylor, Carl H., et al., "Monolayer Single-Crystal 1T'-MoTe2 Grown by Chemical Vapor Deposition Exhibits Weak Antilocalization Effect". NanoLetters, 2016, 16, 4297-4304.*

Wang, Jiao, et al., "Direct growth of molybdenum disulfide on arbitrary insulating surfaces by chemical vapor deposition". RSC Advances, 2015, 5, 4364.*

Smith, Brian J., et al., "Insight into the crystallization of amorphous imine-linked polymer networks to 2D covalent organic frameworks". Chem. Commun., 2016, 52, pp. 3690-3693.*

Ji, Qingqing, et al., "Chemical vapour deposition of group-VIB metal dichalcogenide monolayers: engineered substrates from amorphous to single crystalline". Chemical Society Reviews, Jul. 22, 2014, pp. 1-18.*

Huang, Pinshane Y., et al., "Direct Imaging of a Two-Dimensional Silica Glass on Graphene". Nano Letters, 2012, 12, 1081-1086.*

Ishihara et al., "Improving Crystalline Quality of Sputtering-deposited MoS2 Thin Film by Postdeposition Sulfurization Annealing Using $(t-C_4H_9)_2S_2$," Jpn. J. Appl. Phys., vol. 55, No. 4S, 04EJ07, Published Mar. 2, 2016, pp. 1-3, abstract only.

* cited by examiner

FABRICATION METHOD FOR TWO-DIMENSIONAL MATERIALS

BACKGROUND OF THE INVENTION

1. Field of the Invention

The present invention relates to a fabrication method for two-dimensional materials; particularly, the present invention relates to a fabrication method for large-area and evenly distributed two-dimensional materials.

2. Description of the Prior Art

Two-dimensional materials are substances having single layer or few layers with an atomic level thickness. Two-dimensional materials have gained highly attention because of their special characteristics in electrical conduction, optical and mechanical properties. For example, graphene has properties such as high carrier mobility and transparency.

Nowadays, fabrication methods for two-dimensional materials mainly include mechanical exfoliation, molecular beam epitaxy (MBE), and chemical vapor deposition (CVD). The mechanical exfoliation method requires manual effort and cannot provide stable quality. Besides, the mechanical exfoliation method is merely utilized for producing two-dimensional materials within a limited area and is hard to implement in large area two-dimensional materials. Though the MBE method can deposit two-dimensional materials having structure with few layers, it still cannot implement in large area two-dimensional materials. Besides, the MBE method requires an ultrahigh vacuum environment that will spend much process time and money.

Comparing to the previous two methods, the CVD method can improve the production efficiency; however, the CVD method has many limitations, such as selection of precursor, control of vapor pressure, and design of gas-phase transport in a furnace, etc. Those limitations will increase complexity of process design. Therefore, fabrication methods for two-dimensional materials need to be improved.

SUMMARY OF THE INVENTION

It is an object of the present invention to provide a fabrication method for two-dimensional materials to decrease complexity of process.

It is another object of the present invention to provide a fabrication method for two-dimensional materials to improve quality of two-dimensional materials.

The fabrication method for two-dimensional materials includes the following steps: forming a thin film having at least one two-dimensional element on a substrate; forming at least one capping layer on the thin film; annealing the thin film to form a two-dimensional material film after the capping layer is formed.

DETAILED DESCRIPTION OF THE PREFERRED EMBODIMENT

Figure 1:
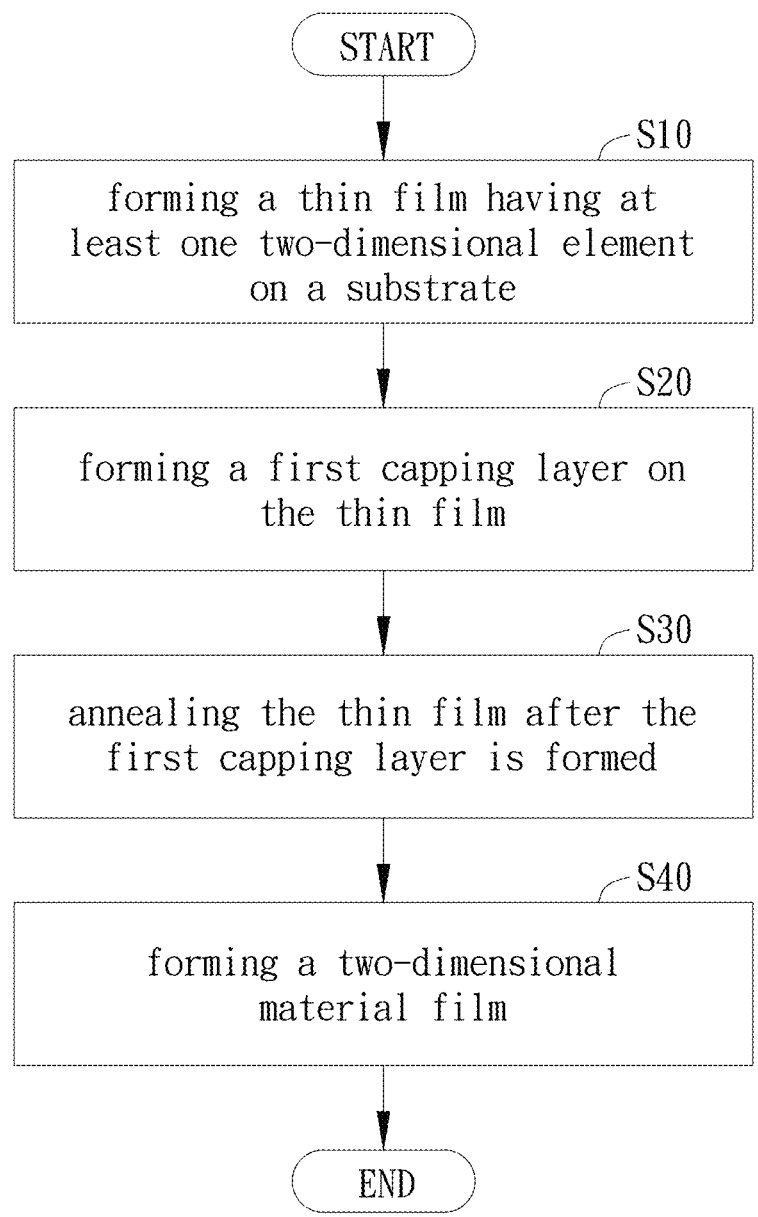
FIG. 1 is a flow chart of an embodiment of a fabrication method for two-dimensional materials of the present invention.
Figure 2A:
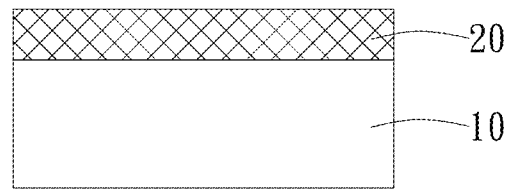
FIGS. 2A, 2B, 2C, and 2D are schematic views of an embodiment of fabricating two-dimensional materials.

The present invention provides a fabrication method for two-dimensional materials. Please refer to FIG. 1. FIG. 1 is a flow chart of an embodiment of a fabrication method for two-dimensional materials of the present invention. As shown in FIG. 1, the fabrication method for two-dimensional materials includes several stages, such as thin film formation, capping layer formation, anneal, and two-dimensional material film formation. FIGS. 2A, 2B, 2C, and 2D are schematic views of an embodiment of fabricating two-dimensional materials. As shown in FIG. 1 and FIG. 2A, in step 10: forming a thin film 20 having at least one two-dimensional element on a substrate 10. In one embodiment, in the step of thin film 20 formation, the thin film 20 can be formed by using physical vapor deposition. The substrate 10 can include Si, Ge, SiGe, SiC, GaAs, InGaAs, InP, InAs, $SiO_2$, $Si_3N_4$, sapphire, $Al_2O_3$, $HfO_2$, $ZrO_2$, $TiO_2$, $Ta_2O_5$, ZnO, and IGZO.

Figure 2B:
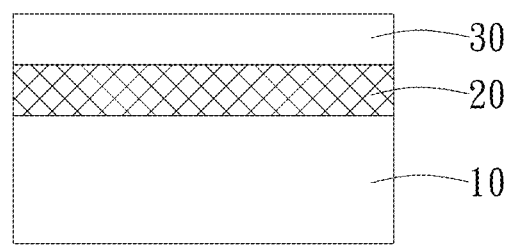

Next, in step S20: forming a first capping layer on the thin film. As shown in FIG. 2B, the first capping layer 30 is formed on the thin film 20. The thin film 20 is located between the substrate 10 and the first capping layer 30. The first capping layer 30 is served as a protective layer for the thin film 20 to ensure stable quality in forming the thin film 20. The first capping layer 30 can include $SiO_2$, $Si_3N_4$, $SiO_x$, $SiN_x$, Si, Ge, $Al_2O_3$, $HfO_2$, $ZrO_2$, $TiO_2$, $Ta_2O_5$, ZnO, and IGZO. In general, a deposition thickness of the thin film is in a range between 0.5 nm and 10 μm. A thickness of the first capping layer is in a range between 5 nm and 10 μm.

Figure 2C:
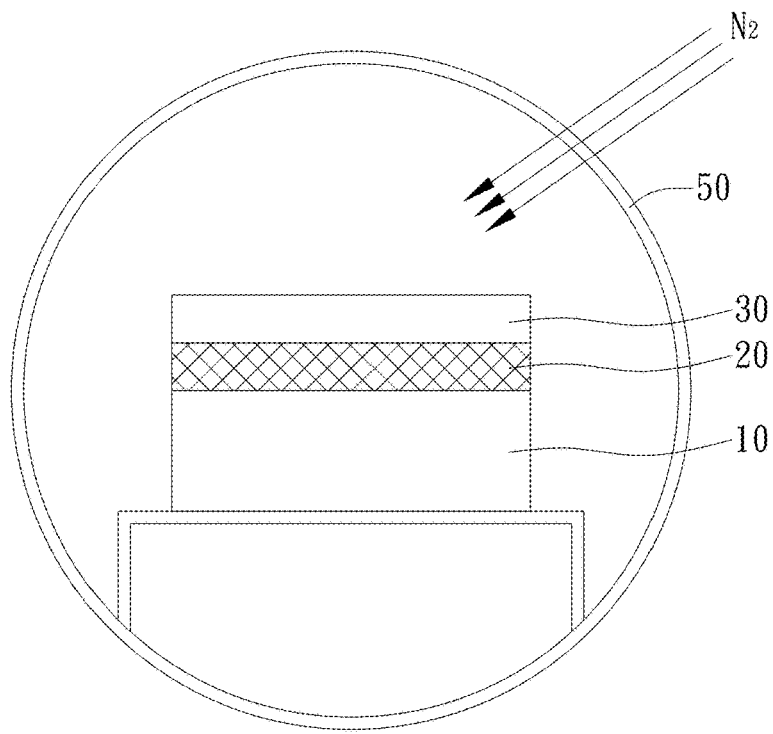
Figure 2D:
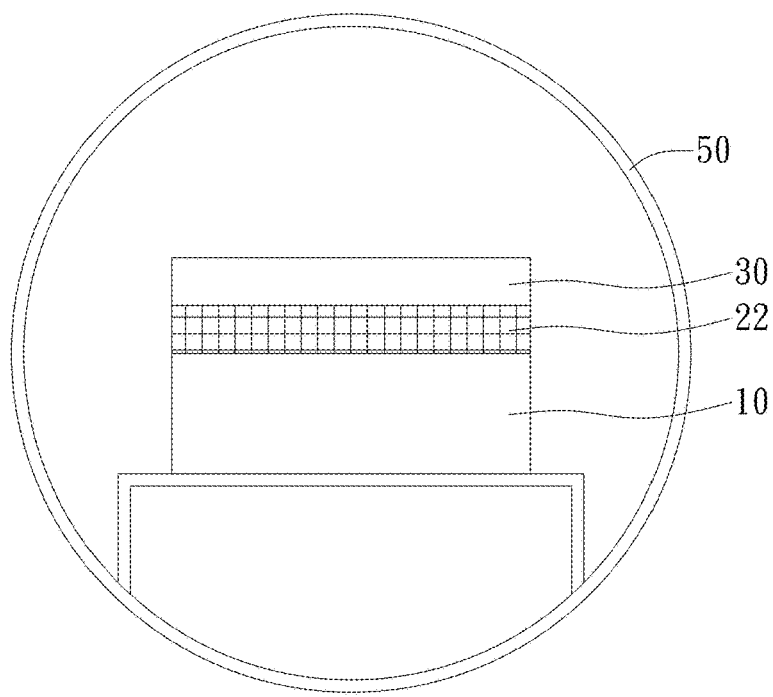

In step S30: annealing the thin film after the first capping layer is formed. As shown in FIG. 2C, a sample, having the first capping layer 30 and the thin film 20, is disposed in a furnace 50 and annealed in a gas (for example, $N_2$). An annealing temperature is in a range between 300° C. and 1200° C. The annealing method can adopt, for example, furnace annealing, rapid thermal annealing, laser annealing, or microwave annealing. Said annealing step is performed after the first capping layer is formed. By this design, the first capping layer can prevent the two-dimensional element in the thin film from damaging during the annealing process to improve the quality of the two-dimensional material. Besides, in the annealing step, the first capping layer can serve as a control layer, i.e. during the thin film forming the two-dimensional material film, the thin film is limited not to grow in a three dimensional direction but to grow in a two-dimensional direction instead. In step S40: forming a two-dimensional material film. As shown in FIG. 2D, the two-dimensional material film 22 is formed after the annealing process.

The two-dimensional material film mentioned above can be made from the film being a two-dimensional hetero-layer or a two-dimensional elemental layer. In one embodiment, the two-dimensional material film can be transition-metal dichalcogenides (also expressed as MX2), for example, $MoS_2$, $MoTe_2$, $WTe_2$, etc. Particularly, the thin film is a two-dimensional hetero-layer including at least one transition metal and at least one chalcogen element as the two-dimensional element. The transition metal is selected from the group consisting of Molybdenum, Tungsten, Chromium, Vanadium, Niobium, Tantalum, Platinum, Titanium, Hafnium, Zirconium, and Rhenium, and the chalcogen element is selected from the group consisting of Sulfur, Selenium, and Tellurium.

It is noted that the two-dimensional material film, formed from the transition metal as well as the chalcogen element mentioned above, is not limited to the binary form. The two-dimensional material film can also be the multiple form, such as $Mo_xW_{(1-x)}Te_2$, $MoS_{2x}Se_{2(1-x)}$, and Ta-doped, Nb-doped $MoS_2$.

Taking the two-dimensional material film made from the transition metal as well as the chalcogen element as an example, in the step of forming the thin film, sputtering or evaporation is performed by using at least one target having the transition metal and the chalcogen element. In one embodiment, in the step of forming the thin film, a single target can be adopted, wherein the transition metal and the chalcogen element in the target have a stoichiometric ratio. In another embodiment, the thin film can be formed by co-sputtering or co-evaporating multi-targets depending on manufacture requirements, and each of multi-targets includes one of the two-dimensional elements (such as the transition metal and the chalcogen element). For example, co-sputtering is performed by using multi-targets according to proportion of ingredients in the two-dimensional material film with the multiple forms. By this design, parameters in each target can be adjusted to increase the manufacturing flexibility.

Besides, the annealing step is preferably performed in a chalcogen-free atmosphere. In other words, complicated reactions such as heating chalcogen powder become volatile can be avoid to simplify the manufacture process by using the first capping layer of the present invention. For the thin film including the transition metal and the chalcogen element, the first capping layer can serve as a chalcogen blocked layer, i.e. preventing the chalcogen element sublimation and out-diffusion in high temperature.

In another embodiment, the two-dimensional material film can be transition-metal carbide/nitride (also expressed as MXene), for example, $Ti_3C_2$, TaC, etc. Particularly, the thin film is a two-dimensional hetero-layer including at least one transition metal and at least one non-metallic element as the two-dimensional element. The transition metal is selected from the group consisting of Molybdenum, Tungsten, Chromium, Vanadium, Niobium, Tantalum, Platinum, Titanium, Hafnium, Zirconium, and Rhenium; the non-metallic element is selected from the group consisting of Carbon and Nitrogen. Similarly, the two-dimensional material film can also be the multiple form, such as $Ti_3(C_{0.5}N_{0.5})_2$ $(Ti_{0.5}Nb_{0.5})_2C$. The first capping layer can prevent the loss of the two-dimensional element in the thin film during the annealing process to improve the quality of two-dimensional materials. In addition, in the annealing process, the first capping layer can serve as a control layer, i.e. limiting the thin film not to grow in a three dimensional direction but to grow in a two-dimensional direction instead.

In another embodiment, the two-dimensional material film can be graphene family, for example, BN, BP, GaN, AlGaN, and other compounds having chalcogen element, for example, $In_2Se_2$, InSe, InTe. Particularly, the thin film is a two-dimensional hetero-layer including at least one element of Group 13 and at least one element of Group 15 or Group 16 in the periodic table as the two-dimensional element. The element of Group 13 is selected from the group consisting of Boron, Aluminum, Gallium, and Indium. The element of Group 15 is selected from the group consisting of Nitrogen and Phosphorus. The element of Group 16 is selected from the group consisting of Sulfur, Selenium, and Tellurium.

For the thin film that is a two-dimensional elemental layer, this kind of thin film can form the two-dimensional material film such as phosphorene, silicene, borophene, etc. Particularly, the thin film is a two-dimensional elemental layer. The two-dimensional element is selected from the group consisting of Carbon, Germanium, Silicon, Tin, Gallium, Phosphorus, Selenium, and Tellurium.

Figure 3:
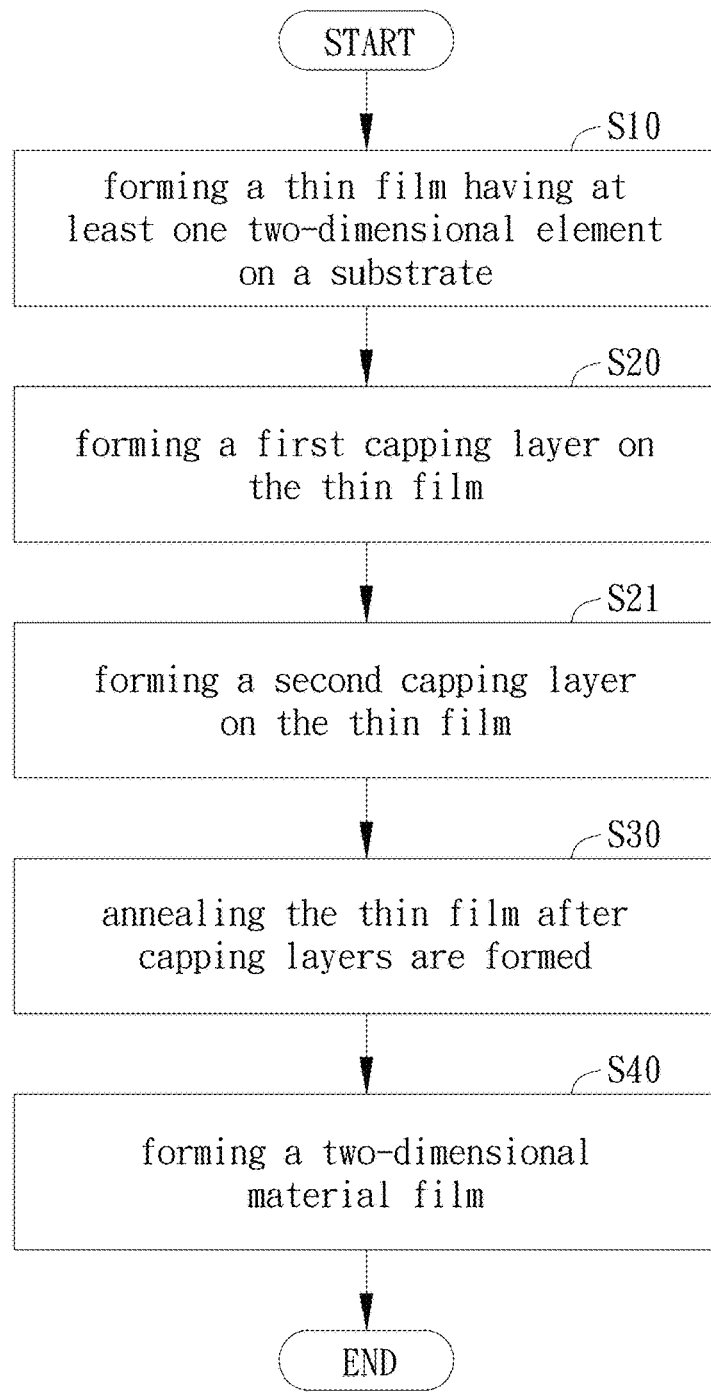
FIG. 3 is a flow chart of another embodiment of a fabrication method for two-dimensional materials of the present invention.
Figure 4A:
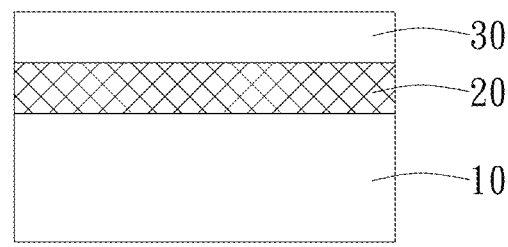
FIGS. 4A, 4B, 4C, and 4D are schematic views of another embodiment of fabricating two-dimensional materials.

FIG. 3 is a flow chart of another embodiment of a fabrication method for two-dimensional materials of the present invention. As shown in FIG. 3, in the fabrication method for two-dimensional materials, the formation of the capping layer can further divided into two stages. Please also refer to FIGS. 4A, 4B, 4C, and 4D that illustrates schematic views of fabricating two-dimensional materials. As shown in FIG. 3 and FIG. 4A, the thin film 20 is formed on the substrate 10 in steps S10 and S20. The thin film 20 has at least one two-dimensional element, and the first capping layer 30 is formed on the thin film 20. The thin film 20 is located between the first substrate 10 and the first capping layer 30.

Figure 4B:
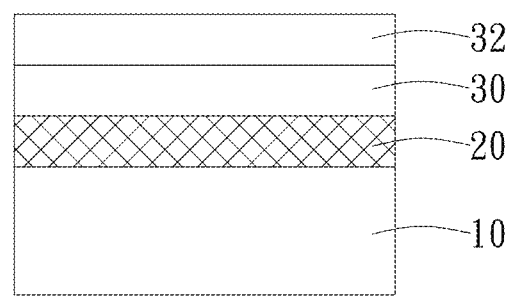

In step S21: forming a second capping layer on the thin film. As shown in FIG. 4B, the second capping layer 32 is formed on the thin film 20. The first capping layer 30 and the second capping layer 32 are formed on the same side of the thin film 20 opposite to the substrate 10. The first capping layer 30 is located between the thin film 20 and the second capping layer 32. The first capping layer 30 and the second capping layer 32 can include $SiO_2$, $Si_3N_4$, $SiO_x$, $SiN_x$, Si, Ge, $Al_2O_3$, $HfO_2$, $ZrO_2$, $TiO_2$, $Ta_2O_5$, ZnO, and IGZO. In general, a deposition thickness of the thin film is preferably in a range between 0.5 nm and 10 μm. A thickness of the first capping layer (or the second capping layer) is preferably in a range between 5 nm and 10 μm.

Figure 4C:
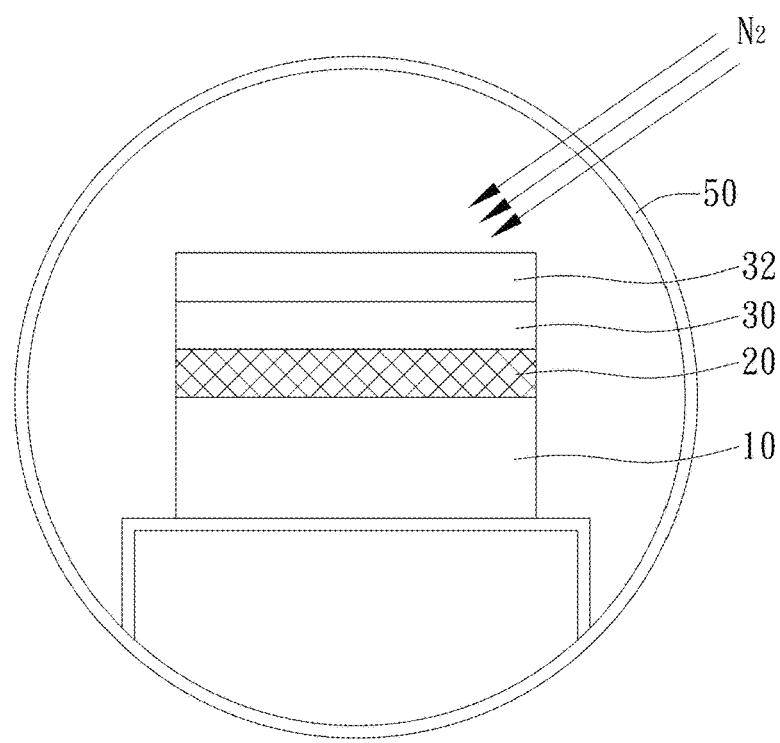

Next, in step S30: annealing the thin film after capping layers (including the first capping layer and the second capping layer) are formed. As shown in FIG. 4C, a sample, having the first capping layer 30, the second capping layer 32 and the thin film 20, is disposed in a furnace 50 and annealed in a gas (for example, $N_2$). An annealing temperature is in a range between 300° C. and 1200° C. Said annealing step is performed after the first capping layer 30 and the second capping layer 32 are formed. By this design, the first capping layer 30 and the second capping layer 32 can prevent the two-dimensional element in the thin film 20 from damaging during the annealing process to improve the quality of the two-dimensional material.

In one embodiment, the first capping layer is formed on the thin film by using evaporation, and the second capping layer is formed on the first capping layer by using plasma-enhanced chemical vapor deposition. By this design, a density of the second capping layer is larger than a density of the first capping layer i.e. the thin film has capping layers with different density formed thereon. In the annealing stage, the first capping layer and the second capping layer can together serve as a protective layer for the thin film to ensure stable quality in forming the thin film. The quality of the thin film can be further improved by using the second capping layer having higher density.

Figure 4D:
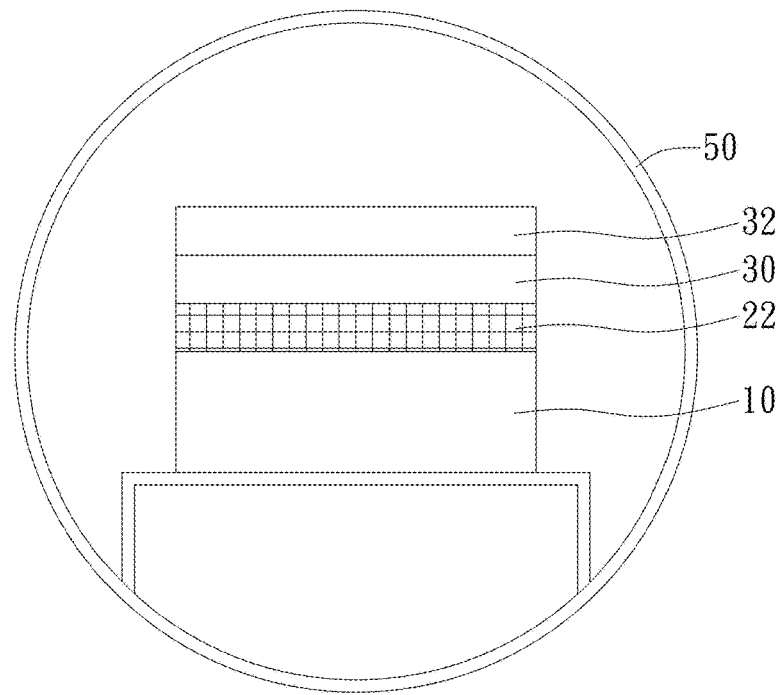

Besides, in the process forming the second capping layer, the first capping layer can serve as a protective layer for the thin film so as to prevent the thin film from damaging during the formation of the second capping layer. In step S40: forming a two-dimensional material film. As shown in FIG. 4D, the two-dimensional material film 22 is formed after the annealing process.

Figure 5:
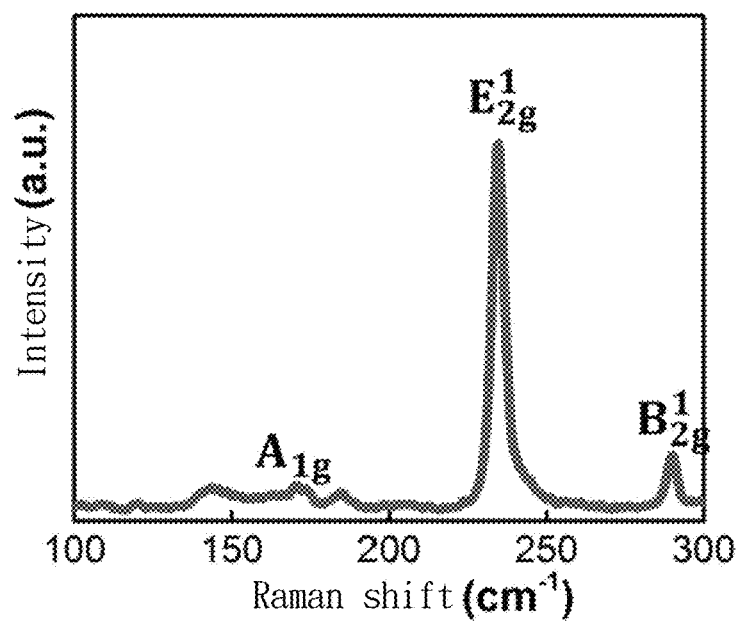
FIG. 5 is Raman spectrum of a 2H-$MoTe_2$ two-dimensional material film.

FIG. 5 is Raman spectrum of the 2H-$MoTe_2$ two-dimensional material film. 2H-$MoTe_2$ is one of the structural phases of $MoTe_2$. According to the process shown in FIG. 3, the 2H-$MoTe_2$ two-dimensional material film is produced by using a $MoTe_2$ target with sputtering time of 30 seconds. A $MoTe_2$ thin film is deposited on a 3 cm×4 cm $SiO_2$ substrate. Then two $SiO_2$ layers, serving as protective layers and each having 50 nm thickness, are formed on the $MoTe_2$ thin film. In the annealing stage, the $MoTe_2$ sample is annealed at 650° C. in the furnace for 24 hours and then cooled naturally to 200° C. to obtain the 2H-$MoTe_2$ two-dimensional material film. As shown in FIG. 5, the 2H-$MoTe_2$ two-dimensional material film has Raman peaks near wavenumbers of 171.4 $cm^{-1}$ ($A_{1g}$), 234.7 $cm^{-1}$ ($E^1_{2g}$), and 290.0 $cm^{-1}$ ($B^1_{2g}$).

Figure 6:
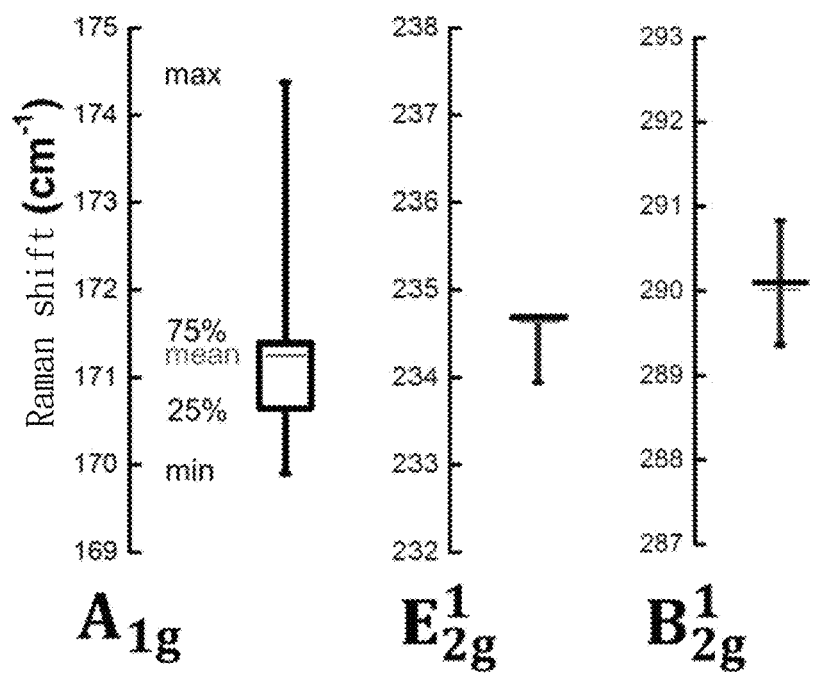
FIG. 6 is statistics of major Raman peaks at different positions of the 2H-$MoTe_2$ two-dimensional material film.

Please refer to FIG. 6. FIG. 6 is statistics of major Raman peaks at different positions of the 2H-$MoTe_2$ two-dimensional material film. As shown in FIG. 6, according to statistics of major Raman peaks ($A_{1g}$, $E^1_{2g}$, $B^1_{2g}$) determined from 60 positions on 3 cm×4 cm 2H-$MoTe_2$ two-dimensional material film. It can be found that variation in wavenumbers of these Raman peaks is small. This demonstrates that the method of the present invention provides uniform quality and centimeter-scaled large area of the 2H-$MoTe_2$ two-dimensional material film.

Figure 7:
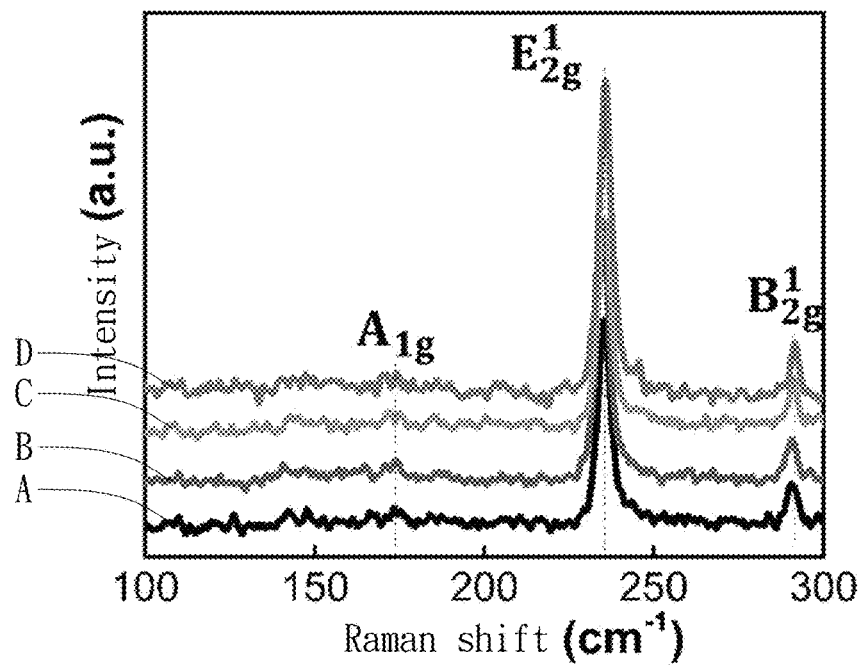
FIG. 7 is Raman spectra of the 2H-$MoTe_2$ two-dimensional material film stored for different time lengths.

FIG. 7 is Raman spectra of the 2H-$MoTe_2$ two-dimensional material film stored for different time lengths. FIG. 7 depicts changes in Raman spectrum of the 2H-$MoTe_2$ two-dimensional material film stored in a vacuum desicator for different time length. In FIG. 7, curves A, B, C, D, each represents initial state, 5 days, 12 days, and 66 days. As shown in FIG. 7, Raman spectra of the 2H-$MoTe_2$ two-dimensional material film have no obvious change when the 2H-$MoTe_2$ two-dimensional material film is stored more than two months. This demonstrates that the method of the present invention provides the 2H-$MoTe_2$ two-dimensional material film having stable quality.

Figure 8:
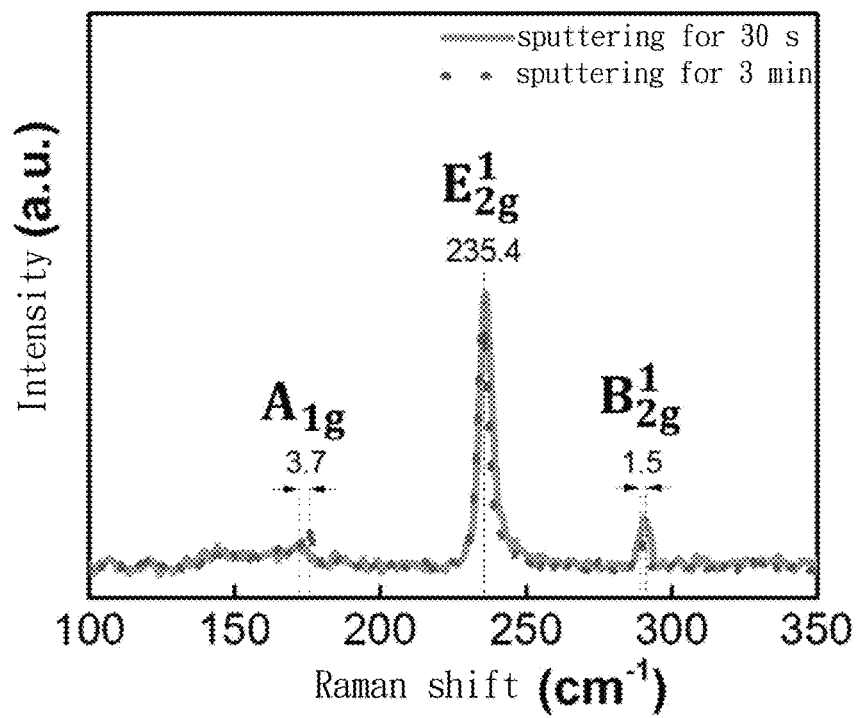
FIG. 8 is Raman spectra of the 2H-$MoTe_2$ two-dimensional material film produced by using different deposition durations.

FIG. 8 is Raman spectra of the 2H-$MoTe_2$ two-dimensional material film produced by using different deposition durations. In FIG. 8, solid curve represents the 2H-$MoTe_2$ two-dimensional material film is produced with sputtering time of 30 seconds. Broken curve represents the 2H-$MoTe_2$ two-dimensional material film is produced with sputtering time of 3 minutes. As shown in FIG. 8, variation in wavenumbers of major Raman peaks of the 2H-$MoTe_2$ two-dimensional material film remains constant. This demonstrates that the method of the present invention provides can provide stable quality for different deposition thickness and has good controllability.

Figure 9:
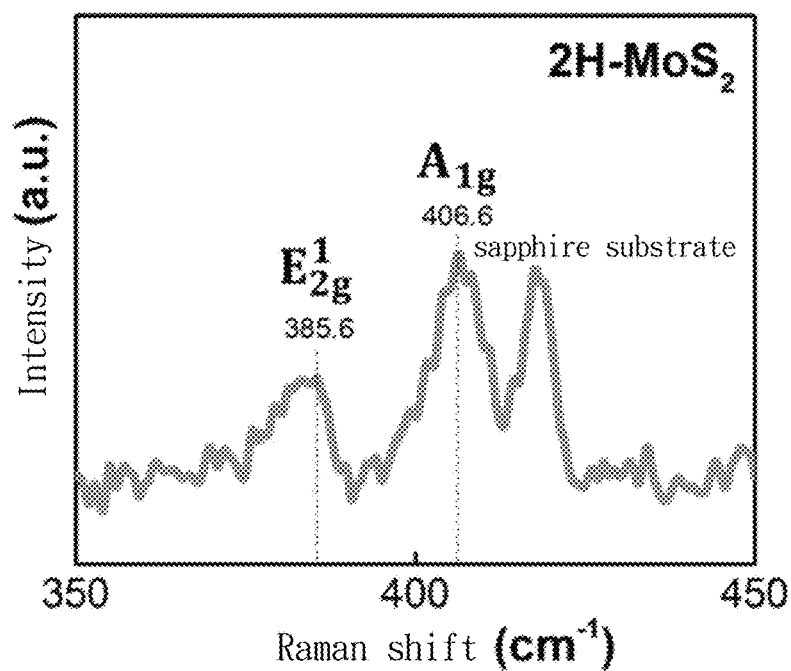
FIG. 9 is Raman spectrum of a 2H-$MoS_2$ two-dimensional material film.
Figure 10:
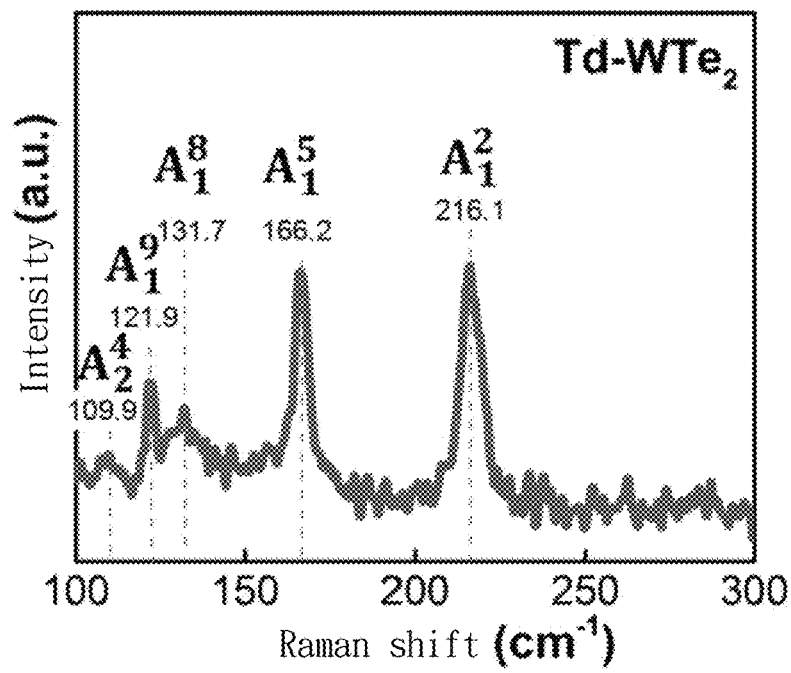
FIG. 10 is Raman spectrum of a Td-$WTe_2$ two-dimensional material film.

In addition, please refer to FIG. 9 and FIG. 10. FIG. 9 is Raman spectrum of a 2H-$MoS_2$ two-dimensional material film. The 2H-$MoS_2$ two-dimensional material film is produced according to the process shown in FIG. 3. A $MoS_2$ target is sputtered for 10 seconds, depositing $MoS_2$ on a sapphire substrate. Then two $SiO_2$ layers, served as capping layers, are formed on a $MoS_2$ thin film. In the annealing stage, the $MoS_2$ sample is annealed at 780° C. in the furnace for 12 hours and then cooled naturally to obtain the 2H-$MoS_2$ two-dimensional material film. As shown in FIG. 9, the 2H-$MoS_2$ two-dimensional material film has Raman peaks near wavenumbers of 385.6 $cm^{-1}$ ($E^1_{2g}$) and 406.6 $cm^{-1}$ ($A_{1g}$).

FIG. 10 is Raman spectrum of a Td-$WTe_2$ two-dimensional material film. Similarly, the Td-$WTe_2$ two-dimensional material film is produced according to the process shown in FIG. 3. A $WTe_2$ target is sputtered for 30 seconds, depositing $WTe_2$ on a sapphire substrate. Then two $SiO_2$ layers, served as capping layers, are formed on a Td-$WTe_2$ thin film. In the annealing stage, the $WTe_2$ sample is annealed at 750° C. in the furnace for 1 hour and then cooled naturally to obtain Td-$WTe_2$ two-dimensional material film. As shown in FIG. 10, the Td-$WTe_2$ two-dimensional material film has Raman peaks near wavenumbers of 109.9 $cm^{-1}$ ($A^4_2$), 121.9 $cm^{-1}$ ($A^9_1$), 131.7 $cm^{-1}$ ($A^8_1$), 166.2 $cm^{-1}$ ($A^5_1$), and 216.1 $cm^{-1}$ ($A^2_1$). From different experiment results mentioned above, it can be understood that the method of the present invention is suitable for producing different two-dimensional material films and provides good quality.

Figure 11:
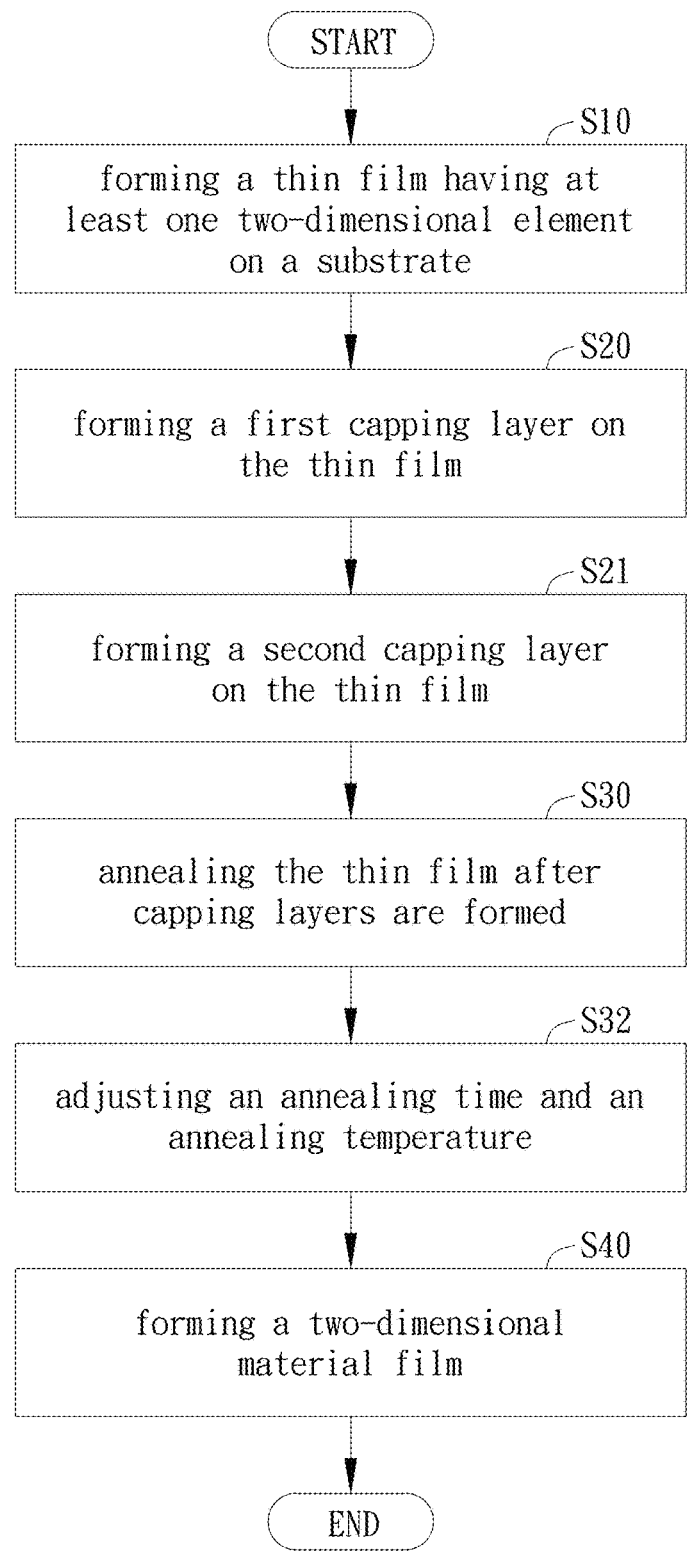
FIG. 11 is a flow chart of another embodiment of a fabrication method for two-dimensional materials of the present invention.

FIG. 11 is a flow chart of another embodiment of a fabrication method for two-dimensional materials of the present invention. For two-dimensional materials having different structural phases, the structural phase can be changed by adjusting an annealing time and/or an annealing temperature. In FIG. 11, steps S10~S30 and S40 are mentioned above and will not elaborate here. In step S32: adjusting an annealing time and an annealing temperature. For example, in the annealing stage, the annealing time and the annealing temperature are adjusted to control the thin film to transform from the two-dimensional material film having a first structural phase to the two-dimensional material film having a second structural phase. The first structural phase and the second structural phase can have different electrical conductivities. For example, the first structural phase has semimetal characteristic, and the second structural phase has semiconductor characteristic. By adjusting the annealing time and/or the annealing temperature, the two-dimensional material film having semimetal characteristic can be turned into the two-dimensional material film having semiconductor characteristic (or vice versa, i.e. the two-dimensional material film having semiconductor characteristic can be turned into the two-dimensional material film having semimetal characteristic).

Figures 12A, 12B, 12C, 12D:
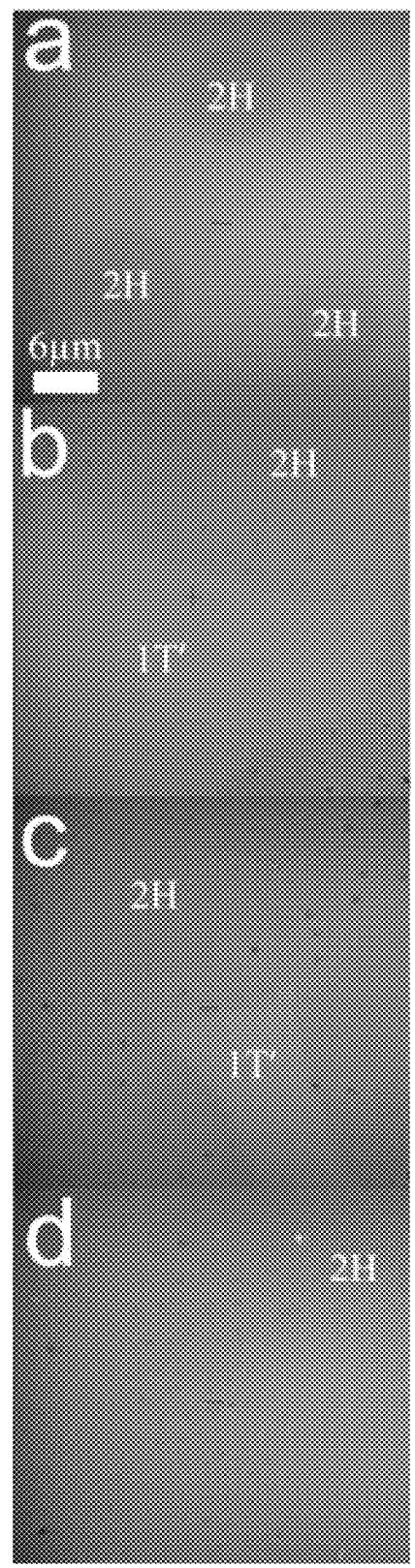
FIGS. 12A, 12B, 12C, and 12D are optical microscope images of the $MoTe_2$ two-dimensional material film in different annealing time lengths.

FIGS. 12A, 12B, 12C, and 12D are optical microscope images of the $MoTe_2$ two-dimensional material film in different annealing time lengths. The $MoTe_2$ sample is annealed in the furnace. The temperature of the furnace is increased at a rate of 37.5° C./min from 200° C. to 650° C., and temperature is maintained at 650° C. for a period of time (3-24 hrs). As shown in FIG. 12A, the $MoTe_2$ two-dimensional material film is mostly in a 1T' structural phase when it is annealed for 3 hrs. As shown in FIGS. 12B (annealed for 6 hrs) and 12C (annealed for 15 hrs), as the annealing time increases, the regions of 2H structural phase gradually expand and become larger than the region of 1T' structural phase. Gray dots in optical microscope images are precipitates of Te, distributing at the boundary of 2H structural phase. As shown in FIG. 12D, the $MoTe_2$ two-dimensional material film is formed a complete 2H structural phase when it is annealed for 24 hrs.

Figure 13A:
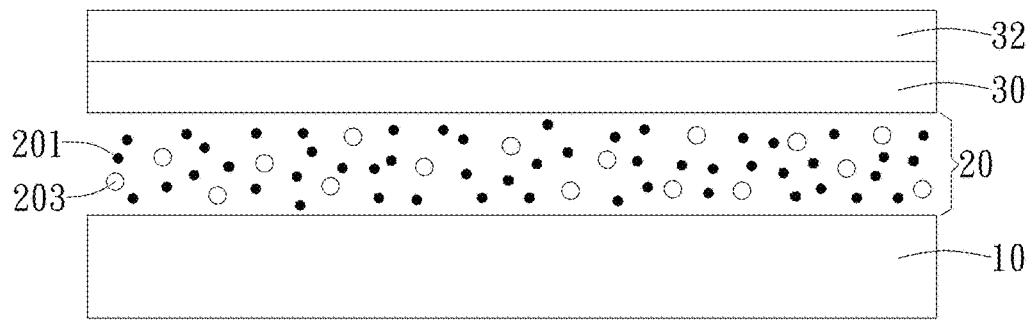
FIGS. 13A, 13B, 13C, 13D, and 13E are schematic views of the $MoTe_2$ two-dimensional material film forming different structural phases.

Please refer to FIGS. 13A-13E. FIGS. 13A, 13B, 13C, 13D, and 13E are schematic views of the $MoTe_2$ two-dimensional material film forming different structural phases. As shown in FIG. 13A, the thin film 20 having Mo 203 and Te 201 is formed on the substrate 10; in addition, the first capping layer 30 and the second capping layer 32 are formed on the thin film 20.

Figure 13B:
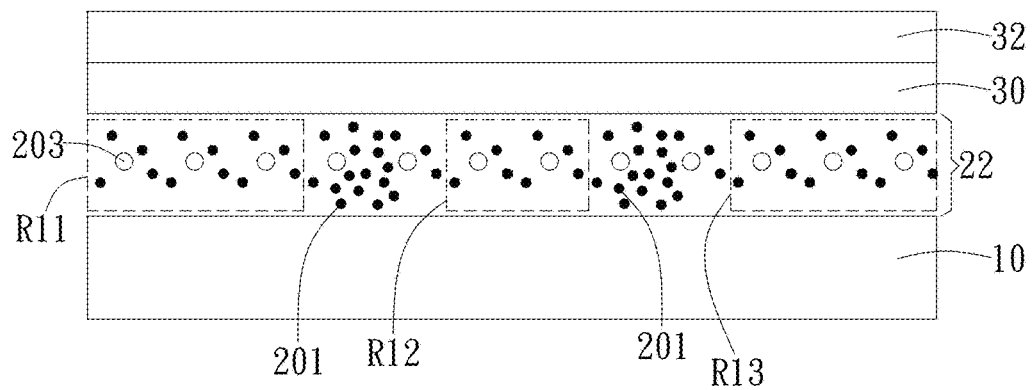

As shown in FIG. 13B, after heating up the $MoTe_2$ sample for a period of time, the $MoTe_2$ two-dimensional material film 22 is formed. The 1T' structural phase is formed at regions R11, R12, and R13. The excessive Te 201 is distributed among those regions.

Figure 13C:
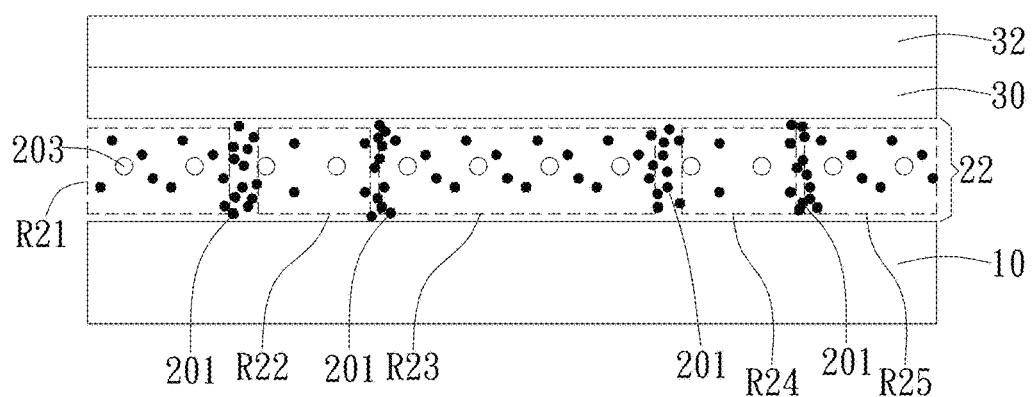

As shown in FIG. 13C, the 2H structural phase starts to form at regions R22 and R24 (generally corresponding to the position of the excessive Te). The 1T' structural phase is located at regions R21, R23, and R25.

Figure 13D:
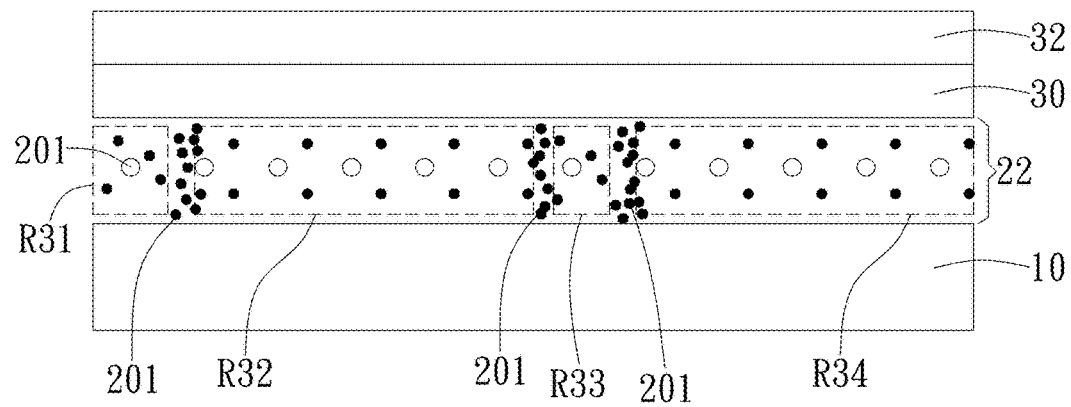

As shown in FIG. 13D, as the annealing time increases, the range of the 2H structural phase becomes larger than the range of the 1T' structural phase in the $MoTe_2$ two-dimensional material film 22. The excessive Te 201 is distributed at the boundary of the 2H structural phase (i.e. at two sides of the region R32 and between the region R33 and the region R34).

Figure 13E:
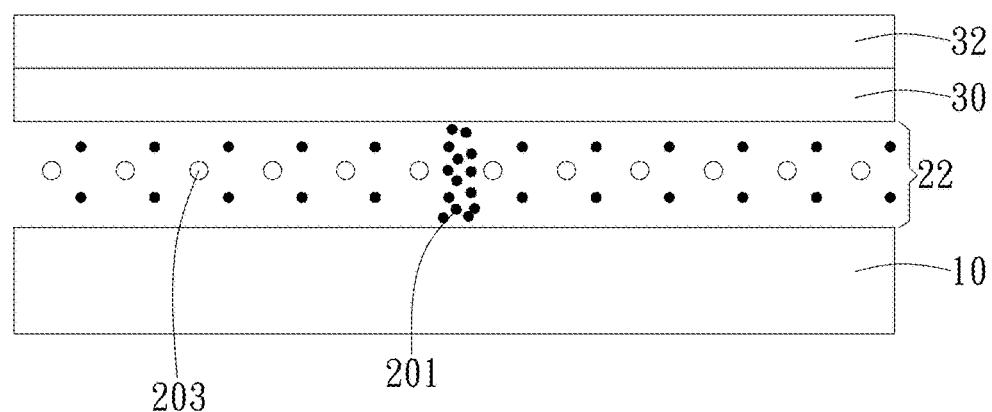

As shown in FIG. 13E, the $MoTe_2$ two-dimensional material film 22 is formed a complete 2H structural phase when it is annealed for 24 hrs. The excessive Te 201 is distributed at the boundary of the 2H-$MoTe_2$ grain. It can be understood from the Te 201 precipitates that the method of the present invention can provide protection for the thin film and prevent the loss of two-dimensional element in the thin film during the annealing process.

As mentioned above, in the step of forming the thin film, the target having the stoichiometric ratio can be adopted to form the thin film by using evaporating or sputtering. In other embodiment, the target having a non-stoichiometric ratio can be adopted to form the thin film by using evaporating or sputtering (for example, Mo:Te is not equal to 1:2), and thus can increase the scalability of the process, such as decreasing the amount of Te precipitates.

Figure 14A:
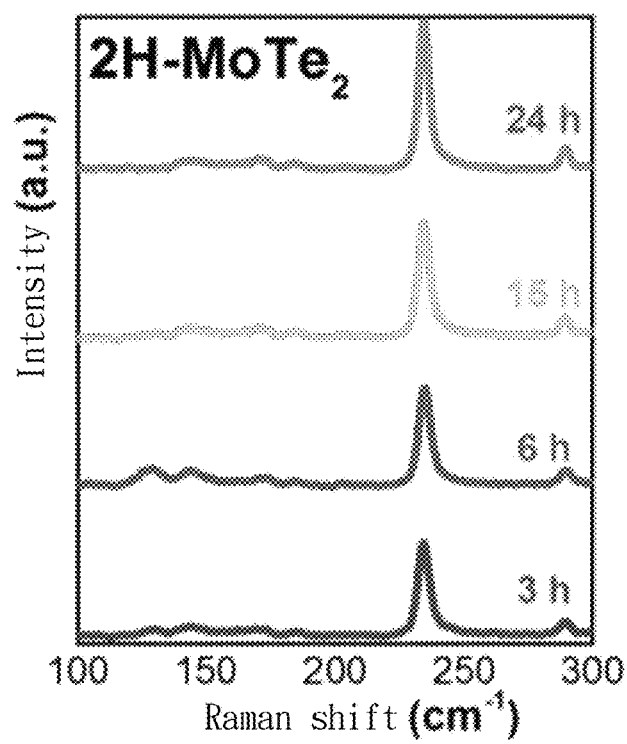
FIG. 14A and FIG. 14B are Raman spectra of the $MoTe_2$ two-dimensional material film forming different structural phases.
Figure 14B:
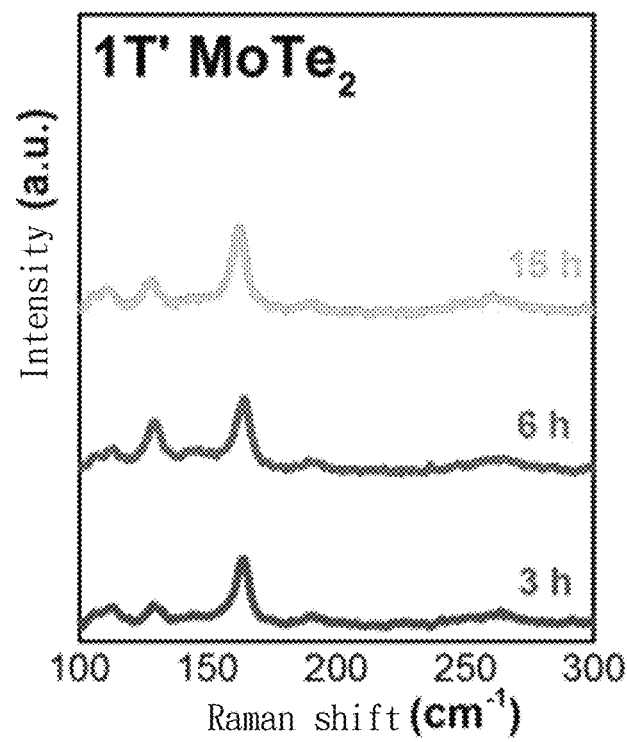

FIG. 14A and FIG. 14B are Raman spectra of the $MoTe_2$ two-dimensional material film forming different structural phases. FIG. 14A depicts Raman spectra of the 2H-$MoTe_2$ two-dimensional material film having different annealing time corresponding to FIGS. 12A to 12D. FIG. 14B depicts Raman spectra of the 1T'-$MoTe_2$ two-dimensional material film having different annealing time corresponding to FIGS. 12A to 12C. As shown in FIG. 14A, the 2H-structural phase can be observed when the $MoTe_2$ two-dimensional material film is annealed for 3 hrs, 6 hrs, 15 hrs, and 24 hrs. As shown in FIG. 14B, the 1T'-structural phase can be observed when the $MoTe_2$ two-dimensional material film is annealed for 3 hrs, 6 hrs, and 15 hrs; besides, no 1T'-structural phase can be observed when the $MoTe_2$ two-dimensional material film is annealed for 24 hrs.

Figure 15C:
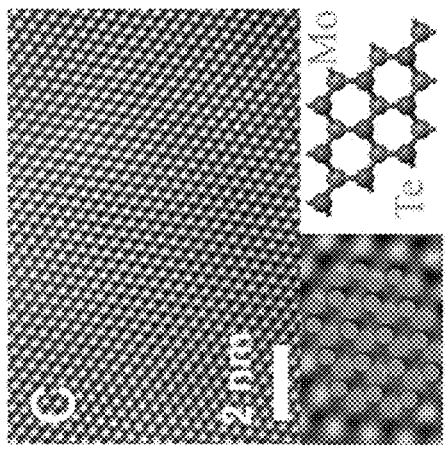
FIG. 15C is a fast Fourier transform image corresponding to FIG. 15B.
Figure 15B:
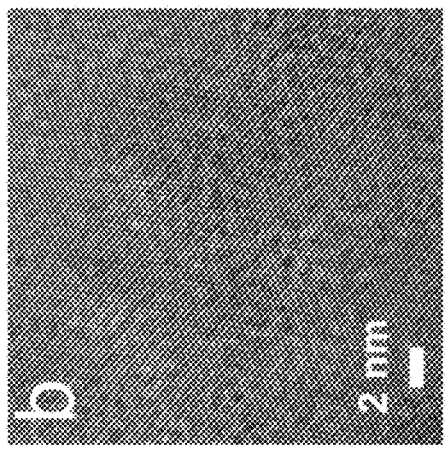
FIG. 15B is a plan view HRTEM image of the 2H-$MoTe_2$ two-dimensional material film.
Figure 15A:
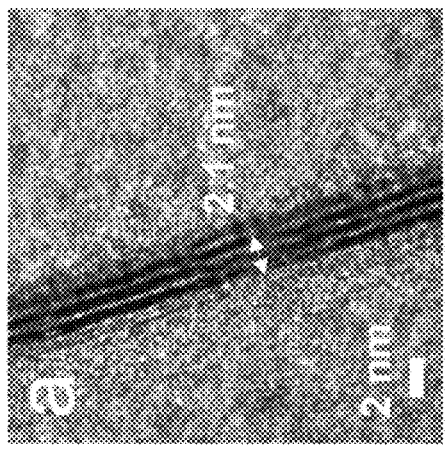
FIG. 15A is a cross-sectional HRTEM image of the 2H-$MoTe_2$ two-dimensional material film.
Figure 15F:
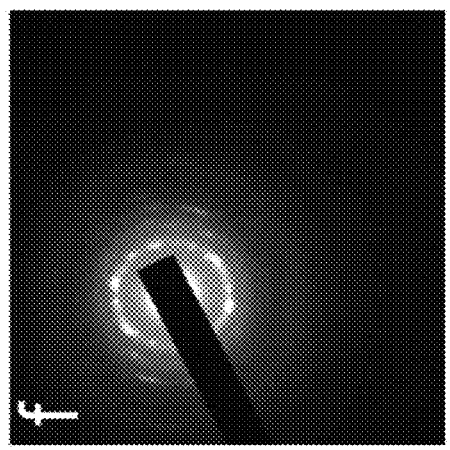
FIG. 15F is SAED pattern of the 1T'-$MoTe_2$ two-dimensional material film.
Figure 15E:
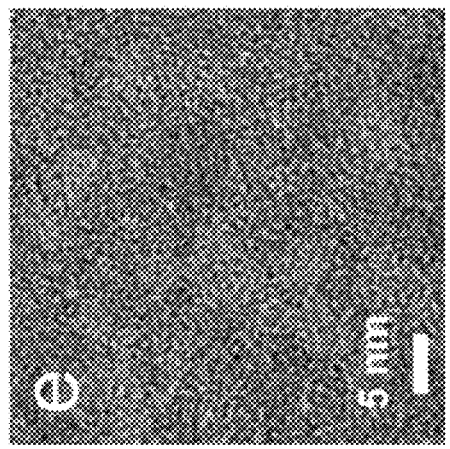
FIG. 15E is a plan view HRTEM image of a 1T'-$MoTe_2$ two-dimensional material film.
Figure 15D:
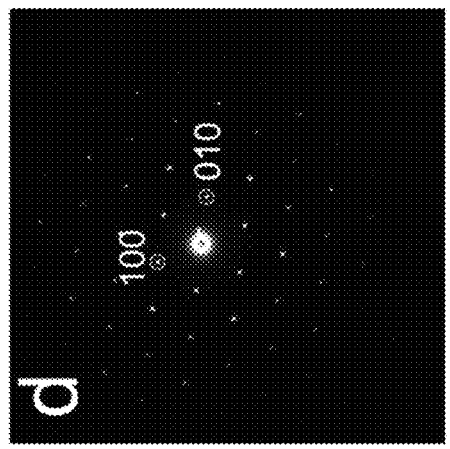
FIG. 15D is SAED pattern of the 2H-$MoTe_2$ two-dimensional material film.

FIGS. 15A-15D are images in connection with the 2H-$MoTe_2$ two-dimensional material film annealed for 24 hrs. FIG. 15A is a cross-sectional HRTEM image of the 2H-$MoTe_2$ two-dimensional material film. As shown in FIG. 15A, the 2H-$MoTe_2$ two-dimensional material film has three-layered structure with thickness of 2.1 nm. FIG. 15B is a plan view, HRTEM image, of the the 2H-$MoTe_2$ two-dimensional material film. FIG. 15C is a fast Fourier transform image corresponding to FIG. 15B. As shown in FIG. 15C, the 2H-$MoTe_2$ two-dimensional material film displays a perfect hexagonal lattice. FIG. 15D is selected-area electron diffraction (SAED) pattern of the 2H-$MoTe_2$ two-dimensional material film. As shown in FIG. 15D, using SAED with a beam diameter of 650 nm, it can be observed that the single crystal 2H-$MoTe_2$ has the diffraction pattern with six-fold symmetry.

Besides, FIGS. 15E-15F are images in connection with the 1T'-$MoTe_2$ two-dimensional material film annealed for 3 hrs. FIG. 15E is a plan view, HRTEM image, of the 1T'-$MoTe_2$ two-dimensional material film. As shown in FIG. 15E, the 1T'-$MoTe_2$ two-dimensional material film has disordered lattice arrangement. FIG. 15F is SAED pattern of the 1T'-$MoTe_2$ two-dimensional material film. As shown in FIG. 15F, using SAED with a beam diameter of 260 nm, it can be observed that the 1T'-$MoTe_2$ is a polycrystalline film. It can be understood from Raman spectra and electron microscope images that the structural phase of the two-dimensional material can be changed by adjusting the annealing time and/or the annealing temperature.

Figure 16:
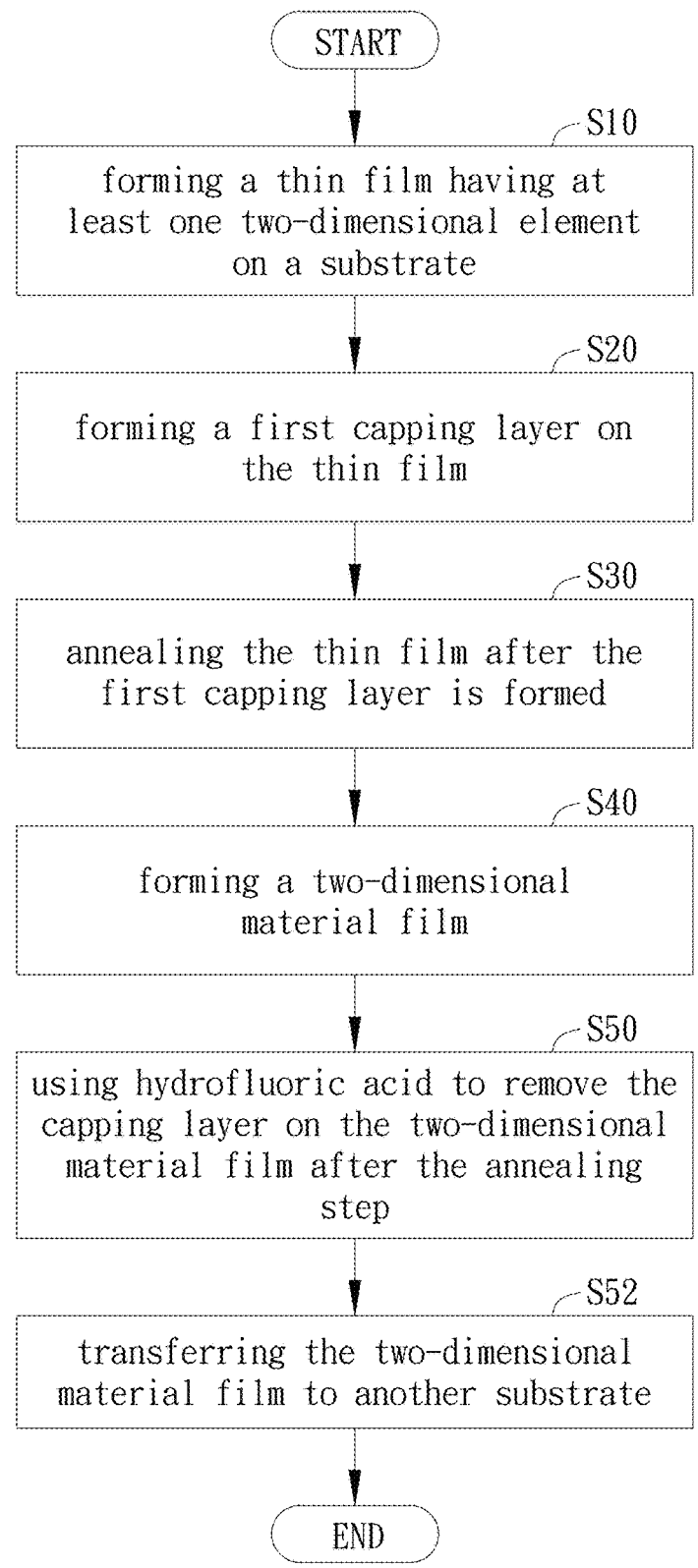
FIG. 16 is flow chart of another embodiment of a fabrication method for two-dimensional materials of the present invention.

FIG. 16 is flow chart of another embodiment of a fabrication method for two-dimensional materials of the present invention. In FIG. 16, steps S10-'S40 are mentioned above and will not elaborate here. In step S50: using hydrofluoric acid to remove the capping layer on the two-dimensional material film after the annealing step. In step S52: transferring the two-dimensional material film to another substrate. For example, before the two-dimensional material film is utilized in the manufacture process of a transistor device, the two-dimensional material film is preferably transferred to a new substrate to avoid using the original substrate that may have been damaged in the annealing process.

Figure 17:
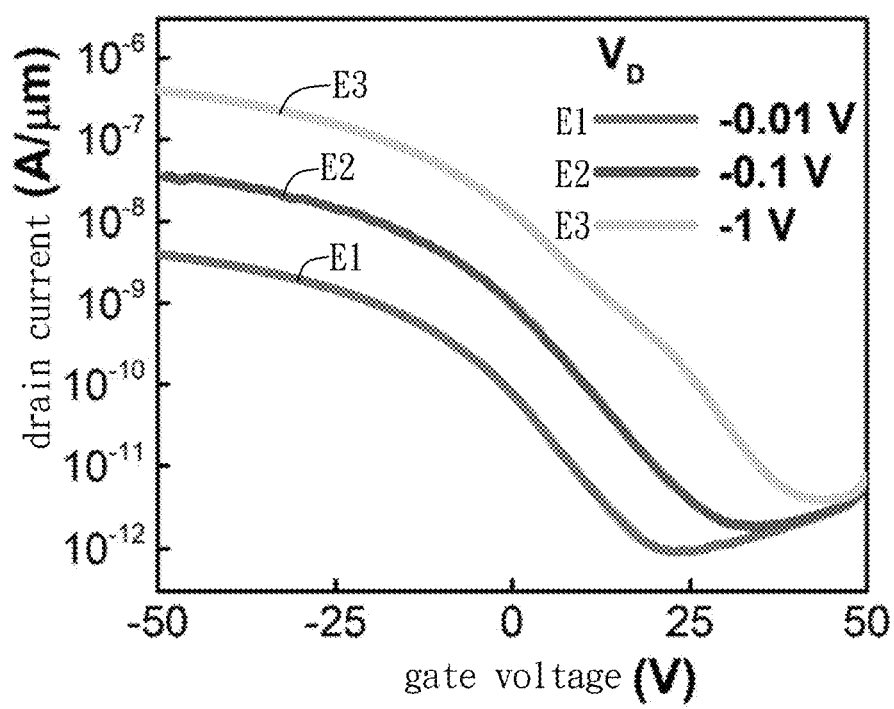
FIG. 17 is a $I_D$-$V_G$ graph of a transistor device adopting the $MoTe_2$ two-dimensional material film.
Figure 18:
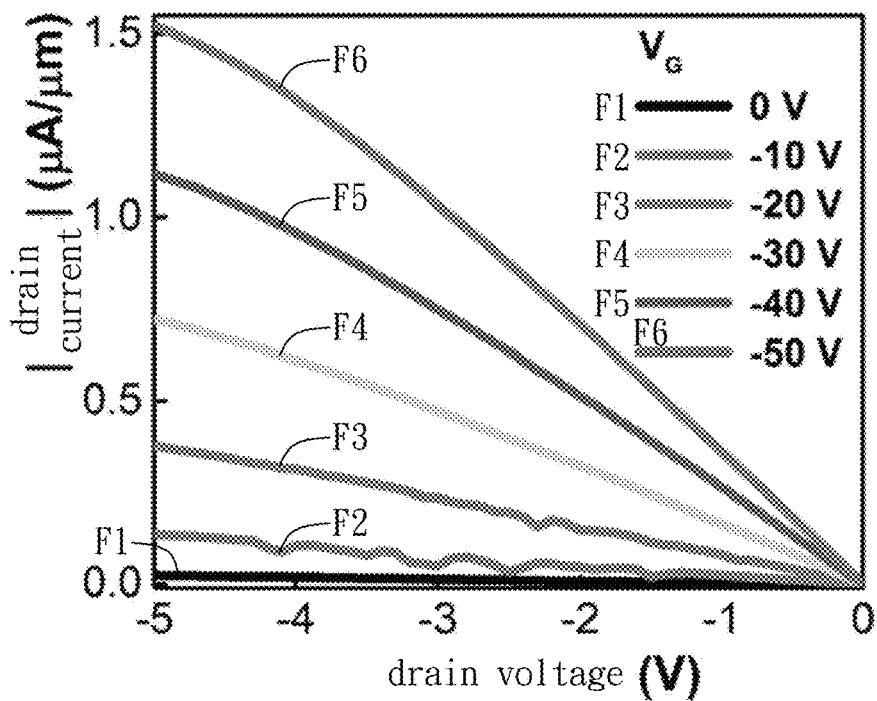
FIG. 18 is a $I_D$-$V_D$ graph of the transistor device adopting the $MoTe_2$ two-dimensional material film.

FIG. 17 is a $I_D$-$V_G$ graph of a transistor device adopting the $MoTe_2$ two-dimensional material film. FIG. 18 is a $I_D$-$V_D$ graph of the transistor device adopting the $MoTe_2$ two-dimensional material film. After the capping layer on the $MoTe_2$ two-dimensional material film is removed and the $MoTe_2$ two-dimensional material film is transferred to the new substrate according to the process mentioned above, Pd is deposited on the $MoTe_2$ two-dimensional material film for serving as source and drain in order to produce a back-gated field effect transistor with 8 μm long channel. As shown in FIG. 17, the transistor shows a good on/off ratio. For example, the on/off ratio of $10^5$ at drain voltage $(V_D)=-1$ (please refer to the curve E3). As shown in FIG. 18, the drain current is proportional to the gate voltage. The drain current approaches zero at gate voltage ($V_G$)=0 (please refer to the curve F1), indicating very small leakage current. The two-dimensional material film, utilized in the transistor device by adapting the method of the present invention, can provide good device characteristics.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A fabrication method for two-dimensional materials, comprising the following steps:
   forming an amorphous thin film having at least one element on a substrate;
   forming at least one capping layer on the amorphous thin film; and
   annealing the amorphous thin film to form a two-dimensional material film after the capping layer is formed, wherein the two-dimensional material film is a crystalline material formed from the at least one element;
   wherein the step for forming the capping layer comprises:
      forming a first capping layer on the amorphous thin film by using evaporation; and
      forming a second capping layer on the first capping layer by using plasma-enhanced chemical vapor deposition,
      wherein a density of the second capping layer is larger than a density of the first capping layer.

2. The fabrication method of claim 1, wherein the amorphous thin film is an amorphous hetero-layer comprising at least one transition metal and at least one chalcogen element; the transition metal is selected from the group consisting of Molybdenum, Tungsten, Chromium, Vanadium, Niobium, Tantalum, Platinum, Titanium, Hafnium, Zirconium, and Rhenium; the chalcogen element is selected from the group consisting of Sulfur, Selenium, and Tellurium.

3. The fabrication method of claim 2, wherein in the step of forming the amorphous thin film, sputtering or evaporation is performed by using at least one target having the transition metal and the chalcogen element; the transition metal and the chalcogen element have a non-stoichiometric ratio.

4. The fabrication method of claim 2, wherein the annealing step is performed in a chalcogen-free atmosphere.

5. The fabrication method of claim 2, wherein the annealing step comprises: adjusting an annealing time and an annealing temperature to control the amorphous thin film to transform into the two-dimensional material film having a first structural phase, the two-dimensional material film having a second structural phase or the two-dimensional material film having both the first structural phase and the second structural phase; the first structural phase and the second structural phase have different electrical conductivities.

6. The fabrication method of claim 1, wherein the amorphous thin film is an amorphous hetero-layer comprising at least one transition metal and at least one non-metallic element; the transition metal is selected from the group consisting of Molybdenum, Tungsten, Chromium, Vanadium, Niobium, Tantalum, Platinum, Titanium, Hafnium, Zirconium, and Rhenium; the non-metallic element is selected from the group consisting of Carbon and Nitrogen.

7. The fabrication method of claim 1, wherein the amorphous thin film is an amorphous elemental layer, and the element is selected from the group consisting of Carbon, Germanium, Silicon, Tin, Gallium, Phosphorus, Selenium, and Tellurium.

8. The fabrication method of claim 1, wherein the amorphous thin film is an amorphous hetero-layer comprising at least one element of Group 13 and at least one element of Group 15 or Group 16 in the periodic table; the element of Group 13 is selected from the group consisting of Boron, Aluminum, Gallium, and Indium; the element of Group 15 is selected from the group consisting of Nitrogen and Phosphorus; the element of Group 16 is selected from the group consisting of Sulfur, Selenium, and Tellurium.

9. The fabrication method of claim 1, wherein a physical vapor deposition is used to form the amorphous thin film in the step of forming the amorphous thin film.

10. The fabrication method of claim 9, wherein the physical vapor deposition includes sputtering or evaporation by using at least one target having the element.

11. The fabrication method of claim 1, wherein a deposition thickness of the amorphous thin film is in a range between 0.5 nm and 10 μm.

12. The fabrication method of claim 1, wherein a thickness of the capping layer is in a range between 5 nm and 10 μm.

13. The fabrication method of claim 1, wherein the first capping layer and the second capping layer are selected from the group consisting of $SiO_2$, $Si_3N_4$, $SiO_x$, $SiN_x$, Si, Ge, $Al_2O_3$, $HfO_2$, $ZrO_2$, $TiO_2$, $Ta_2O_5$, ZnO, and IGZO.

14. The fabrication method of claim 1, wherein in the annealing step, an annealing temperature is in a range between 300° C. and 1200° C.

15. The fabrication method of claim 1, wherein the substrate is selected from the group consisting of Si, Ge, SiGe, SiC, GaAs, InGaAs, InP, InAs, $SiO_2$, $Si_3N_4$, sapphire, $Al_2O_3$, $HfO_2$, $ZrO_2$, $TiO_2$, $Ta_2O_5$, ZnO, and IGZO.

16. The fabrication method of claim 1, after the annealing step, further comprising:
   removing the capping layer on the two-dimensional material film by using hydrofluoric acid; and
   transferring the two-dimensional material film to another substrate.

* * * * *